US008835777B2

(12) United States Patent
Meguro

(10) Patent No.: US 8,835,777 B2
(45) Date of Patent: Sep. 16, 2014

(54) ELECTRONIC DEVICE

(71) Applicant: Hiromasu Meguro, Sagamihara (JP)

(72) Inventor: Hiromasu Meguro, Sagamihara (JP)

(73) Assignee: Casio Computer Co., Ltd, Tokyo (JP)

( * ) Notice: Subject to any disclaimer, the term of this patent is extended or adjusted under 35 U.S.C. 154(b) by 45 days.

(21) Appl. No.: 13/752,506

(22) Filed: Jan. 29, 2013

(65) Prior Publication Data
US 2013/0192889 A1 Aug. 1, 2013

(30) Foreign Application Priority Data

Jan. 31, 2012 (JP) ................................. 2012-017744

(51) Int. Cl.
H05K 5/06 (2006.01)
H05K 5/02 (2006.01)
G06F 1/16 (2006.01)

(52) U.S. Cl.
CPC ............ H05K 5/0217 (2013.01); G06F 1/1626 (2013.01); G06F 1/1624 (2013.01); G06F 1/1656 (2013.01)
USPC .......................................... 174/564; 347/109

(58) Field of Classification Search
CPC .................................................. H05K 5/0239
USPC .......................................... 174/564; 347/109
See application file for complete search history.

(56) References Cited

U.S. PATENT DOCUMENTS

| 4,331,258 | A | * | 5/1982 | Geschwind | ................. | 220/359.5 |
| 5,471,667 | A | * | 11/1995 | Yamada | ........................ | 455/351 |
| 7,563,991 | B2 | * | 7/2009 | Twitchell et al. | ............. | 174/560 |
| 7,825,944 | B2 | * | 11/2010 | Kaiya | ............................ | 347/222 |
| 8,038,011 | B2 | * | 10/2011 | Watanabe et al. | ............... | 206/775 |
| 2005/0162497 | A1 | * | 7/2005 | Matsui et al. | .................. | 347/109 |
| 2005/0279522 | A1 | * | 12/2005 | Shiue et al. | ................. | 174/50.52 |
| 2009/0314044 | A1 | * | 12/2009 | Yang et al. | ....................... | 70/158 |
| 2010/0309613 | A1 | * | 12/2010 | Zuo et al. | ................. | 361/679.01 |
| 2011/0032664 | A1 | * | 2/2011 | Long et al. | ............... | 361/679.01 |

FOREIGN PATENT DOCUMENTS

| JP | 09-001901 | 1/1997 |
| JP | 10-058759 | 3/1998 |
| JP | 2007-157779 | 6/2007 |
| JP | 2007-210133 | 8/2007 |

OTHER PUBLICATIONS

Japanese Office Action for Japanese Patent Application No. 2012-017744 mailed on Dec. 13, 2013.

* cited by examiner

Primary Examiner — Hung Ngo
(74) Attorney, Agent, or Firm — Amin, Turocy & Watson, LLP

(57) ABSTRACT

An electronic device having a slide cover slidably attached in an openable/closable manner to a device case, and conceals a recording paper ejection opening in the device case; a waterproof gasket provided on either one of the slide cover and the device case in a part positioned in periphery of the recording paper ejection opening, and arranged between the slide cover and the device case surrounding the recording paper ejection opening, when the slide cover conceals the recording paper ejection opening; and a guide member which does not come in contact with the waterproof gasket on another side of the slide cover and the device case with which the waterproof gasket meets face to face during a sliding motion of the slide cover, and the waterproof gasket presses on both sides between the slide cover and the device case when the sliding motion is completed.

8 Claims, 10 Drawing Sheets

ELECTRONIC DEVICE

CROSS-REFERENCE TO RELATED APPLICATION

This application is based upon and claims the benefit of priority from the prior Japanese Patent Application No. 2012-017744, filed Jan. 31, 2012, the entire contents of which is incorporated herein by reference.

BACKGROUND OF THE INVENTION

1. Field of the Invention

The present invention relates to electronic devices, such as portable information terminals and portable personal computers.

2. Description of the Related Art

For example, as described in Japanese Patent Application Laid-Open (Kokai) Publication No. 2007-210133, a portable electronic device equipped with a printer is known, where a printer cover conceals a recording paper storage section provided in the device case which is openable/closable. In this state, information is printed on recording paper stored in the recording paper storage section, and the printed recording paper is sequentially ejected from a recording paper ejection opening in the device case.

In this type of portable electronic device equipped with a printer, water drops, such as rain water, can readily seep in from the recording paper ejection opening to the printer section when being carried outdoors in wet weather. Therefore, it has been considered to conceal the recording paper ejection opening with a cover which is openable/closable.

However, although water drops, such as rain water, can be prevented from directly seeping into the recording paper ejection opening simply by being equipped with a cover which conceals the recording paper ejection opening in an openable/closable manner, there is the possibility that water drops, such as rain water, adhered to the cover may wraparound to the back surface side of the cover and seep in from the recording paper ejection opening.

SUMMARY OP THE INVENTION

An object of the present invention is to prevent water drops from seeping into a recording paper ejection opening by a slide cover, and to prevent abrasion of a waterproof gasket from which the slide cover is made to slide smoothly and is arranged in the slide cover, thereby enhancing the durability of the waterproof gasket.

In accordance with one aspect of the present invention, there is provided an electronic device comprising: a slide cover which is slidably attached in an openable/closable manner to a device case and conceals a recording paper ejection opening provided in the device case; a waterproof gasket which is provided on either one of the slide cover and the device case in a part positioned in periphery of the recording paper ejection opening, and arranged between the slide cover and the device case surrounding the recording paper ejection opening, when the slide cover conceals the recording paper ejection opening; and a guide member which does not come in contact with the waterproof gasket on another side of the slide cover and the device case with which the waterproof gasket meets face to face during a sliding motion of the slide cover, and the waterproof gasket presses on both sides between the slide cover and the device case when the slide cover conceals the recording paper ejection opening and the sliding motion is completed.

In the present invention, while the slide cover prevents water drops from seeping into the recording paper ejection opening, the waterproof gasket prevents abrasion from which the slide cover is made to slide smoothly and is arranged in the slide cover, thereby enhancing the durability of the waterproof gasket.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

FIG. 3A and FIG. 3B are diagrams of a cover opening and closing apparatus of the portable information terminal shown in FIG. 1, in which FIG. 3A is an enlarged side view of main sections of the cover opening and closing apparatus in a state where the printer cover is closed, and FIG. 3B is an enlarged cross-sectional view of main sections of the cover opening and closing apparatus positioned within the device case in this state;

FIG. 4A and FIG. 4B are diagrams of the cover opening and closing apparatus of the portable information terminal shown in FIG. 3A and FIG. 3B, in a state where an operating member is rotated and a lock member is slightly lifting the printer cover upward, in which FIG. 4A is an enlarged side view of main sections of the cover opening and closing apparatus in this state, and FIG. 4B is an enlarged cross-sectional view of main sections of the cover opening and closing apparatus positioned within the device case in this state;

FIG. 5A and FIG. 5B are diagrams of a printer section of the portable information terminal shown in FIG. 1, in which FIG. 5A is an enlarged planar view of main sections in a state where a slide cover of the printer section slides and opens a recording paper ejection opening, and FIG. 5B is an enlarged planar view of main sections in a state where the slide cover of the printer section slides and conceals the recording paper ejection opening;

FIG. 7A and FIG. 7B are diagrams of the slide cover shown in FIG. 5A, in which FIG. 7A is an enlarged planar view thereof and FIG. 7B is an enlarged rear view thereof;

FIG. 9A to FIG. 9C are diagrams showing the sliding states of the slide cover of the printer section shown in FIG. 8, in which FIG. 9A is an enlarged cross-sectional view of main sections in a state where the slide cover slightly slides towards the recording paper ejection opening, FIG. 9B is an enlarged cross-sectional view of main sections in a state where the slide cover slides and comes close to the recording paper ejection opening, and FIG. 9C is an enlarged cross-sectional view of main sections in a state where the slide cover slides and conceals the recording paper ejection opening; and FIG. 10A and FIG. 10B are cross-sectional views of main sections of the printer section shown in FIG. 5A, taken along line B-B, in which FIG. 10A is an enlarged cross-sectional view of main sections in a state where the slide cover is completely opened, and FIG. 10B is an enlarged cross-sectional view of main sections in a state where the slide cover slides and conceals the recording paper ejection opening, and an engaging projected section is pressed downward by a pressing projected section.

DETAILED DESCRIPTION OF THE PREFERRED EMBODIMENTS

Figure 1:
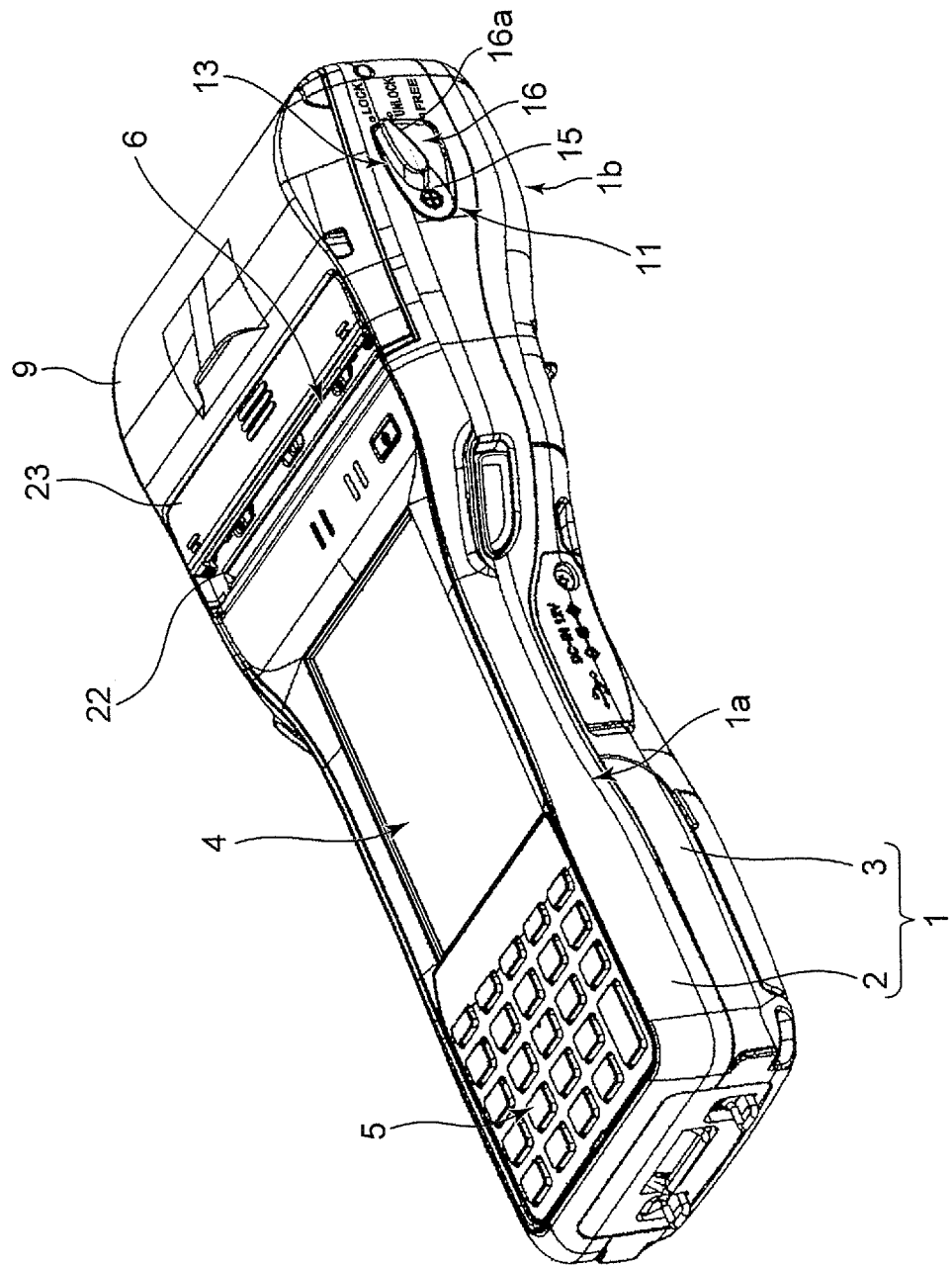
FIG. 1 is a perspective view of an embodiment in which the present invention is applied to a portable information terminal.
Figure 2:
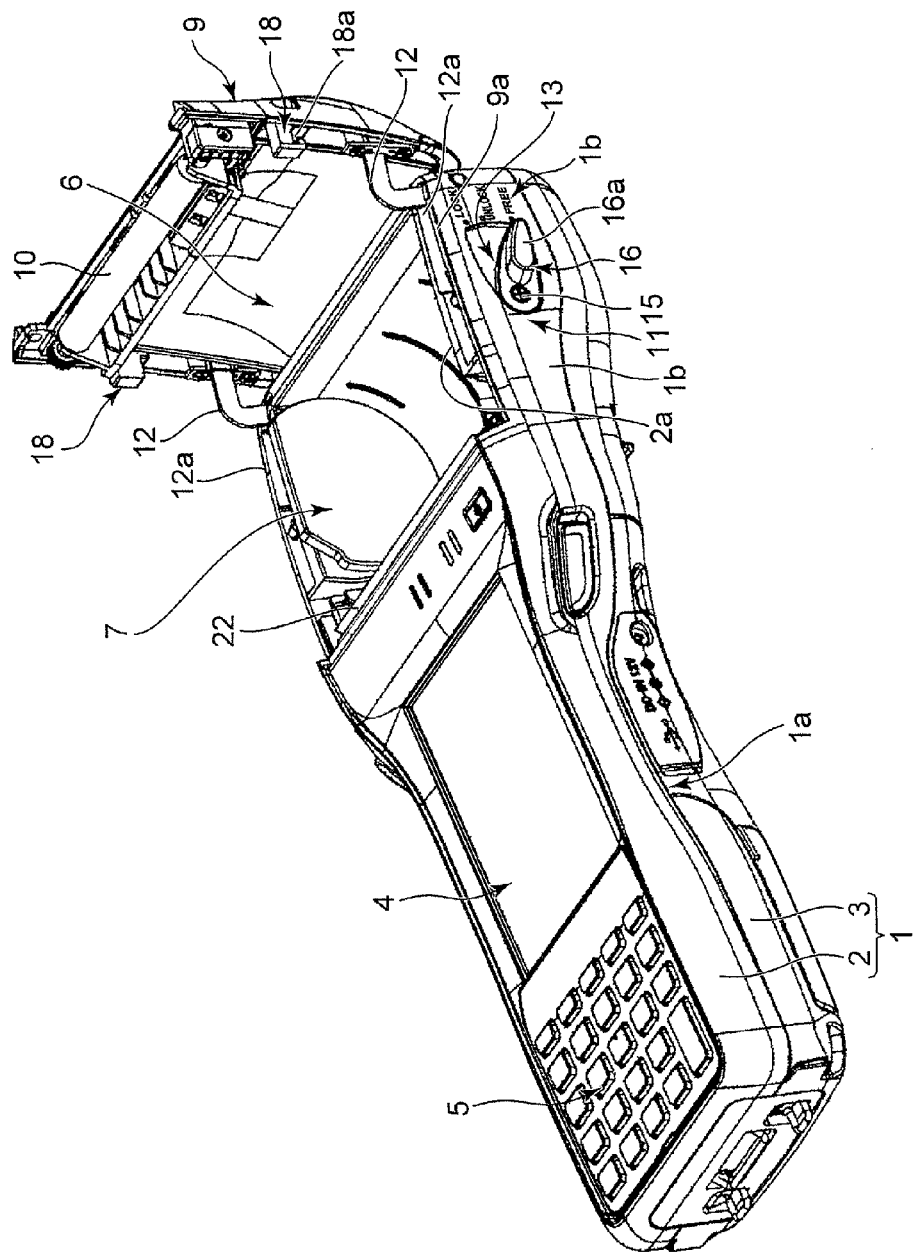
FIG. 2 is a perspective view of the portable information terminal shown in FIG. 1, in a state where the printer cover is opened and stood upright on the device case.

An embodiment in which the present invention has been applied to a portable information terminal will hereinafter be described with reference to FIG. 1 to FIG. 10B. The portable information terminal includes a device case 1, as shown in FIG. 1 and FIG. 2. The device case 1 includes an upper case 2 and a lower case 3.

The device case 1 is formed into a substantially rectangular box shape that is overall elongated in a vertical direction (left/right direction in FIG. 1), as shown in FIG. 1 and FIG. 2. In this structure, the base side of the device case 1 (left side in FIG. 1) is formed into a gripping section 1a having a narrow width, and the tip side (right side in FIG. 1) is formed into a printer mounting section 1b having a wide width. An input display section 4 and a key input section 5 are provided in the gripping section 1a in the upper case 2 of the device case 1.

The input display section 4 is configured such that a transparent touch panel is arranged on the front surface of a display panel. As a result, information displayed on the display panel can be viewed through the transparent touch panel. Accordingly, a user can input information by performing a touch operation on the touch panel while viewing the displayed information. The key input section 5 includes various keys, such as a numeric keypad and a function key. Information is inputted by key operation.

A printer section 6 is provided in the printer mounting section 1b in the upper case 2 of the device case 1, as shown in FIG. 1 to FIG. 3B. The printer section 6 includes a recording paper storage section 7 that is provided within the device case 1 in the printer mounting section 1b, a print head 8 that prints information while successively pulling out recording paper (not shown) stored in the recording paper storage section 7, and a printer cover 9 that conceals the recording paper storage section 7 in an openable/closable manner.

Figure 3A:
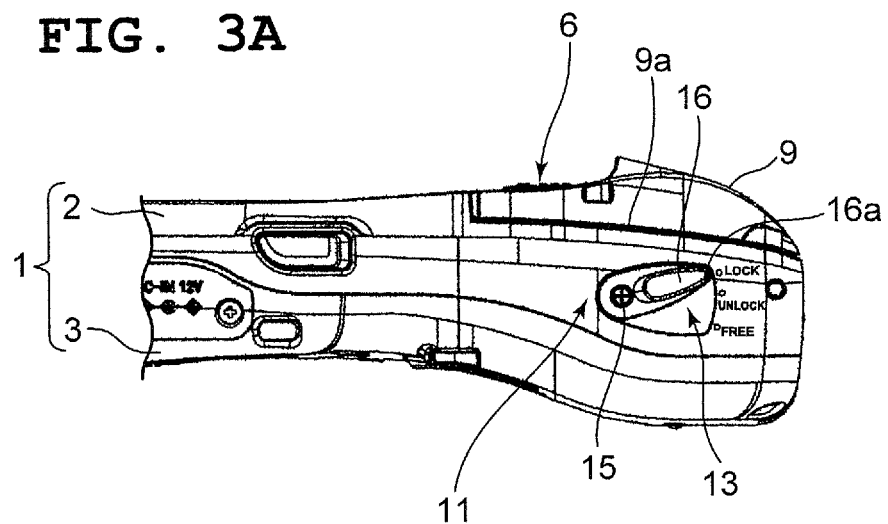
Figure 3B:
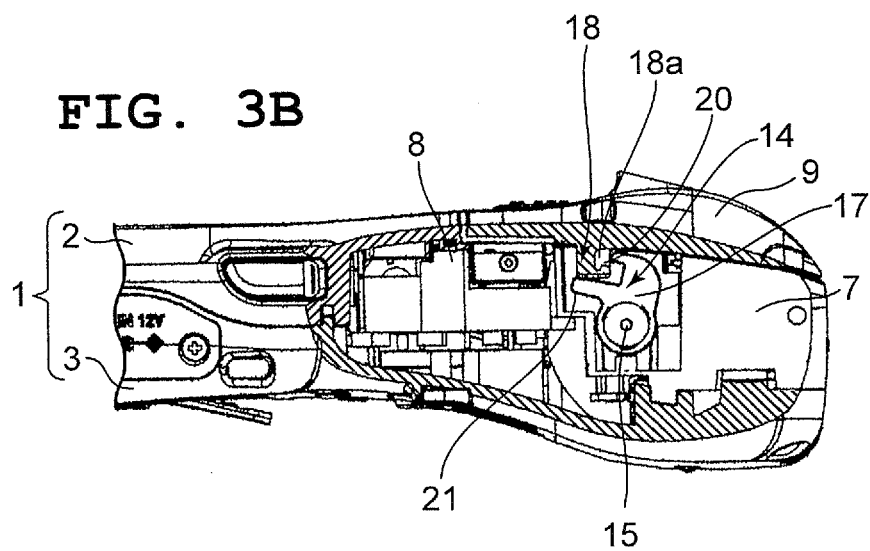

The recording paper storage section 7 is formed in a recessed shape with a substantially semicircular arc within the device case 1 and rotatably stores therein roll-form recording paper (not shown), as shown in FIG. 1 to FIG. 3B. In this structure, a recording paper insertion opening 2a is provided in the upper case 2 of the device case 1 corresponding to the recording paper storage section 7. The print head 8, which is a thermal print head, is provided facing the recording paper storage section 7 positioned on the input display section 4 side within the device case 1, as shown in FIG. 3B.

The printer cover 9 is formed into a curved surface that projects upward and curves in a substantially circular arc shape, as shown in FIG. 1 to FIG. 38. The peripheral edge portion of the printer cover 9 is formed into a frame shape that corresponds to the outer periphery of the recording paper insertion opening 2a of the upper case 2.

In this structure, a waterproof gasket 9a is provided in the frame-shaped peripheral edge portion of the printer cover 9, excluding the edge portion positioned on the print head 8 side, or in other words, a position corresponding to a recording paper ejection opening 22, described hereafter. When the printer cover 9 conceals and closes the recording paper storage section 7, the waterproof gasket 9a comes into elastic contact with the outer periphery of the recording paper insertion opening 2a of the upper case 2.

A platen roller 10 is rotatably provided on the inner surface of the end portion of the printer cover 9 positioned on the input display section 4 side, as shown in FIG. 2. When the printer cover 9 conceals and closes the recording paper storage section 7, the platen roller 10 is placed in contact with or near the print head 8, as shown in FIG. 2 and FIG. 3B.

As a result, the recording paper is fed between the print head 8 and the platen roller 10, and then the print head 8 prints information on the recording paper while pressing the recording paper against the platen roller 10.

Furthermore, the printer cover 9 conceals the recording paper storage section 7 by a cover opening and closing apparatus 11 in an openable/closable manner, as shown in FIG. 2.

The cover opening and closing apparatus 11 includes a pair of rotating support shafts 12 that rotatably supports the printer cover 9 in relation to the device case 1, a pair of operating members 13 that is operably attached to the device case 1 and is exposed outside of the device case 1, and a pair of lock members 14 that locks the printer cover 9 when the recording paper storage section 7 is concealed, as shown in FIG. 2 to FIG. 4B.

The pair of rotating support shafts 12 is respectively provided on both sides of the end portion positioned in the longitudinal direction of the device case 1, as shown in FIG. 2.

The one end portion of the rotating support shaft 12, which is bent into a substantially L-shape, is rotatably attached to the device case 1, and the other end portion is rotatably attached to the print cover 9.

In other words, one end portion of the rotating support shaft 12 is rotatably attached to an end portion within the device case 1 positioned on the opposite side of the print head 8 across the recording paper storage section 7, and the other end portion is rotatably attached to an end portion of the printer cover 9 positioned on the opposite side of the platen roller 10, as shown in FIG. 2.

In this structure, shaft storage sections 12a into which the pair of rotating support shafts 12 is respectively inserted are provided in both side portions of the device case 1 where the pair of rotating support shafts 12 is positioned.

As a result, in order that the printer cover 9 opens by rotating around the pair of rotating support shafts 12, the pair of rotating support shafts 12 rotates in a manner to lift upward the end portion of the printer cover 9 positioned on the opposite side of the platen roller 10 and rotates in a manner to direct upward the end portion of the printer cover 9 positioned on the platen roller 10 side. As a result, the printer cover 9 opens in a state of standing upright on the end portion of the device case 1 positioned on the rotating support shafts 12 side, as shown in FIG. 2.

The pair of operating members 13 respectively includes rotating shaft sections 15 that are rotatably attached to both side portions of the device case 1, and operating lever sections 16 that are exposed outside of the device case 1 and rotate the rotating shaft sections 15, as shown in FIG. 3A to FIG. 4B.

In this structure, in a state where the rotating shaft section 15 is rotatably attached to the side portion of the device case 1, an outer end portion of the rotating shaft section 15 projects outside of the device case 1 and an inner end portion projects within the device case 1. The rotating shaft section 15 rotates in response to the rotating operation of the operating lever section 16 attached to the outer end portion of the rotating shaft section 15.

The operating lever section 16 is formed into a substantially elliptical shape, as shown in FIG. 1 to FIG. 3A and FIG.

4A. One end portion of the operating lever section 16 is attached to the outer end portion of the rotating shaft section 15, and a tip end portion 16*a* positioned on the opposite side of the one end portion is placed projecting towards the rotating support shaft 12 side that is the rotational center of the printer cover 9. In this state, the tip end portion 16*a* rotates in the up/down direction.

Figure 4A:
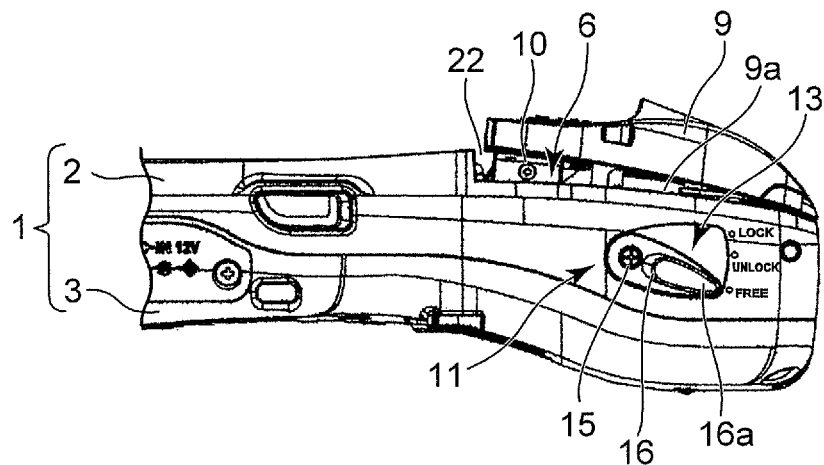
Figure 4B:
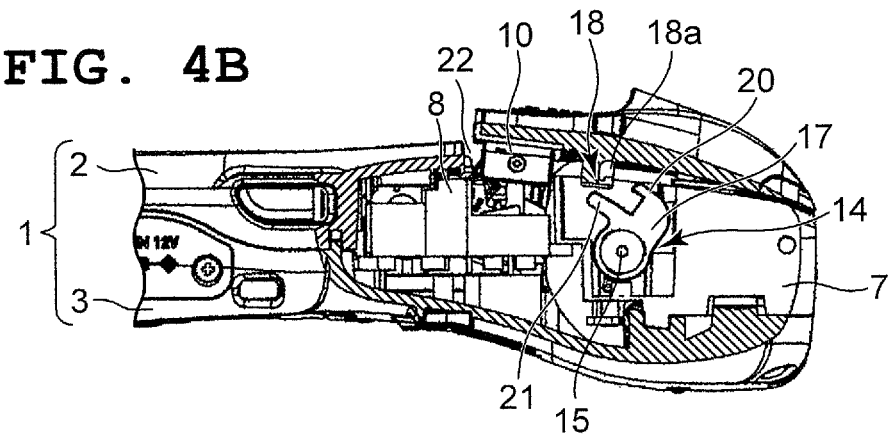

The pair of lock members 14 respectively include interlocking rotating sections 17 that rotate by the rotating operation of the operating members 13, lock sections 20 that are provided in the interlocking rotating sections 17 and that engage with engaging sections 18 of the printer cover 9 and lock the printer cover 9 in a state where the printer cover 9 conceals the recording paper storage section 7, and a lifting upward section 21 that is provided in the interlocking rotating section 17 and that lifts upward the printer cover 9 in an opening direction when the lock on the printer cover 9 by the lock section 20 is released, as shown in FIG. 3B and FIG. 4B.

In this structure, a pair of engaging sections 18 is respectively provided on both sides of the printer cover 9 projecting towards the lock members 14, as shown in FIG. 2 to FIG. 4B.

The pair of engaging sections 18 is respectively provided with groove sections 18*a* that are open in the direction perpendicular to the opening and closing direction of the printer cover 9, or in other words, towards the rotating support shafts 12 side.

The interlocking rotating section 17 is attached to the inner end portion of the rotating shaft section 15 of the operating member 13 and rotates in response to the rotating operation of the operating lever section 16.

The lock section 20 is a projecting section that projects in the direction perpendicular to the opening and closing direction of the printer cover 9, or in other words, towards the opposite side of the rotating support shaft 12, and is provided in the outer peripheral portion of the interlocking rotating section 17, as shown in FIG. 2 to FIG. 4B.

In order that the printer cover 9 conceals the recording paper storage section 7, the lock section 20 is inserted into the groove section 18*a* provided in the engaging section 18 of the printer cover 9 and pulls downward the engaging section 18, whereby the printer cover 9 is pressed against the device case 1.

The lifting upward section 21 is a projecting section that is provided projecting in the direction perpendicular to the opening and closing direction of the printer cover 9, or in other words, towards the opposite side of the rotating support shaft 12, as shown in FIG. 3A to FIG. 4B.

In other words, the lifting upward section 21 is formed in a position positioned nearer to the rotating shaft section 15 side than the lock section 20 of the interlocking rotating section 17, such that the projecting length of the lifting upward section 21 is longer than that of the lock section 20. When the lock section 20 is engaged by being inserted into the groove section 18*a* of the engaging section 18 of the printer cover 9, the lifting upward section 21 is placed close to the underside of the engaging section 18.

As a result, in order that the printer cover 9 is opened, the interlocking rotating section 17 rotates in the clockwise direction by the rotating operation of the operating member 13 and the lock section 20 disengages from the groove section 18*a* of the engaging section 18. Then, the lifting upward section 21 lifts the engaging section 18 upward in accordance with the rotation of the interlinking rotating section 17. As a result, the printer cover 9 is lifted upward in the opening direction, as shown in FIG. 2 and FIG. 4B.

In order that the printer cover 9 is closed, the engaging section 18 of the printer cover 9 comes into contact with the lifting upward section 21 from above and presses the lifting upward section 21 downward, thereby rotating the interlocking rotating section 17 in the counter-clockwise direction. As a result, the lock section 20 is engaged by being inserted into the groove section 18*a* of the engaging section 18, whereby the printer cover 9 is pressed against the device case 1, as shown in FIG. 1 and FIG. 3B.

A slide cover 23 that conceals the recording paper ejection opening 22 is slidably attached in an openable/closable manner to the printer cover 9, as shown in FIG. 1, FIG. 3A and FIG. 3B.

In this structure, the recording paper ejection opening 22 is used to eject, above the device case 1, the recording paper on which information has been printed by the print head 8. The recording paper ejection opening 22 is provided in a slit shape corresponding to the position where the print head 8 and the platen roller 10 face each other when the printer cover 9 closes.

In other words, the recording paper ejection opening 22 is provided across the printer cover 9 and the upper case 2 of the device case 1 when in a closed state where the printer cover 9 conceals the recording paper storage section 7, as shown in FIG. 1 to FIG. 6.

On the other hand, the recording paper ejection opening 22 is positioned only in the upper case 2 of the device case 1 when in an opened state where the printer cover 9 opens the recording paper storage section 7.

In addition, the printer cover 9 is provided with a cover storage recessed section 24 where the slide cover 23 is slidably arranged, as shown in FIG. 5A to FIG. 8.

The slide cover 23 is formed into a band plate shape that is slightly larger than the recording paper ejection opening 22 in a slit shape and is attached within the cover storage recessed section 24 of the printer cover 9 by a cover attachment member 25 such that the slide cover 23 can slide along the longitudinal direction of the device case 1.

Figure 5A:
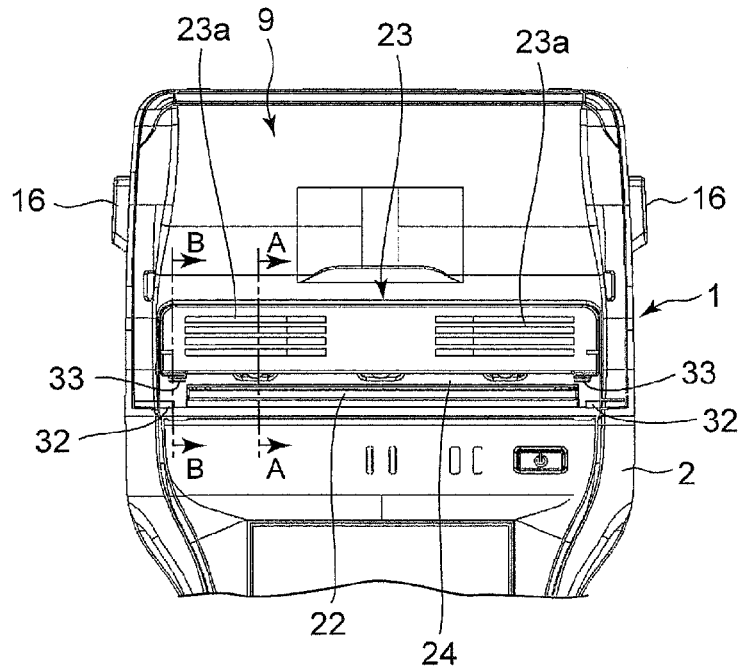
Figure 5B:
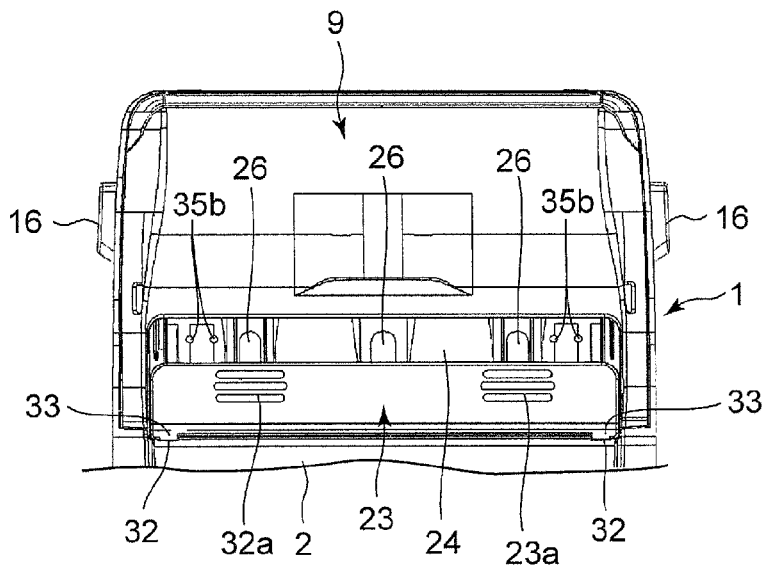
Figure 7A:
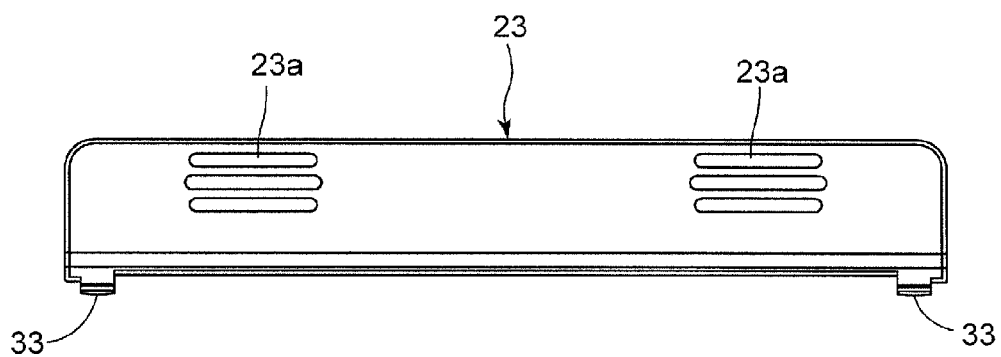

An anti-slip section 23*a* is provided on the top surface of the slide cover 23, as shown in FIG. 5A, FIG. 5B, and FIG. 7.

Figure 7B:
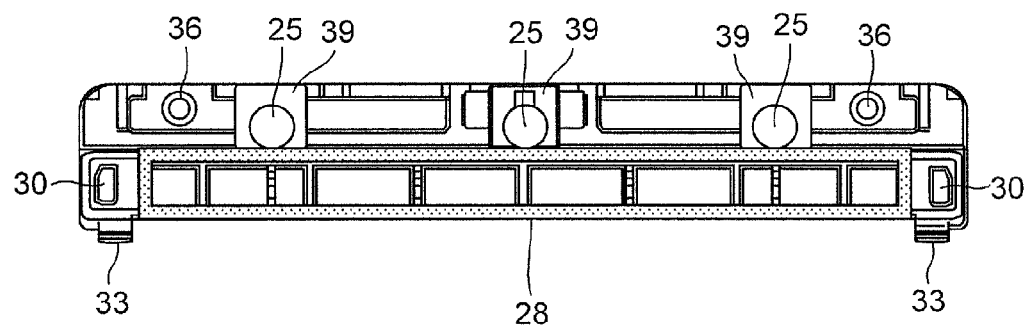
Figure 8:
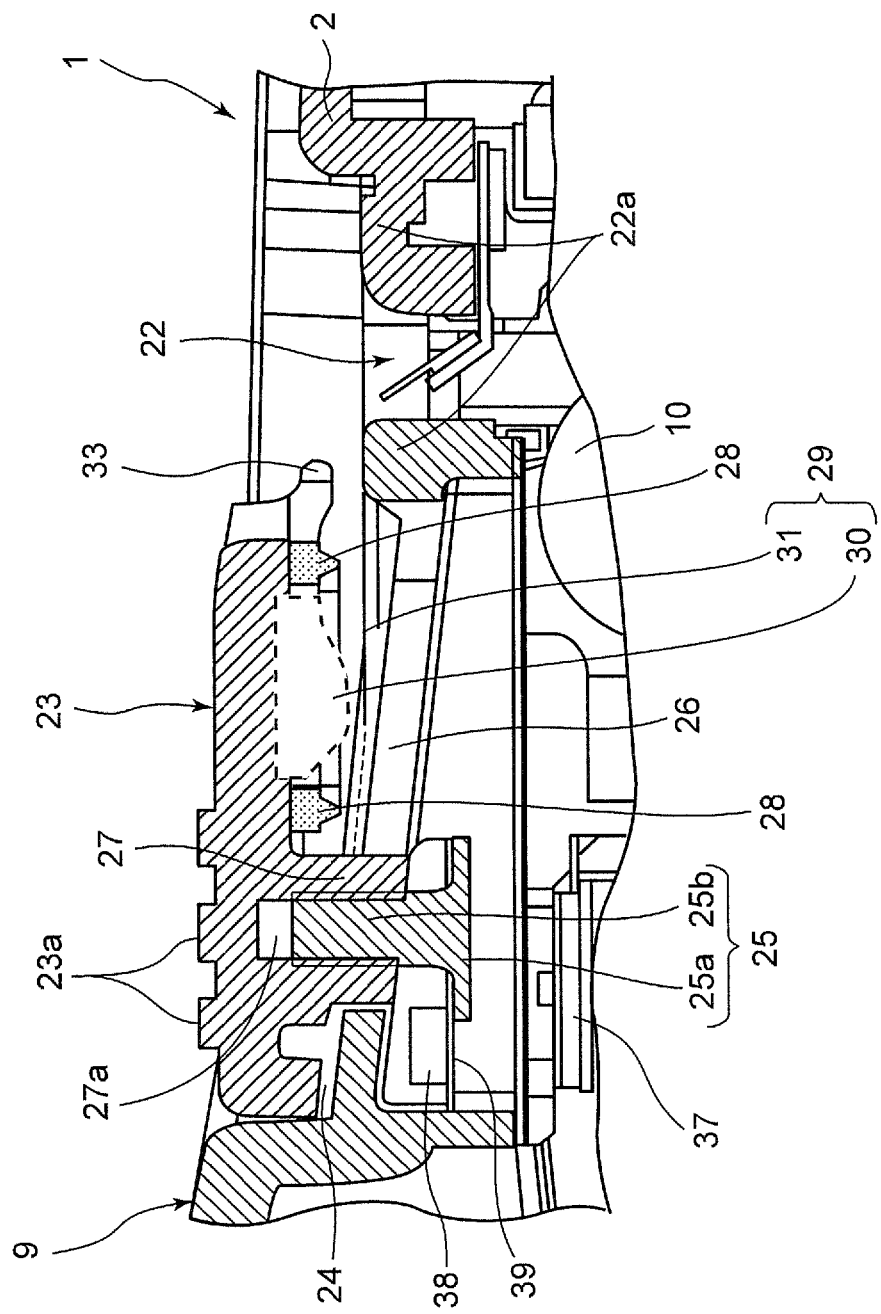
FIG. 8 is an enlarged cross-sectional view of main sections of the printer section shown in FIG. 5A, taken along line A-A.

A pair of guide boss sections 27 is provided on the undersurface of the slide cover 23 such that the pair of guide boss sections 27 is movably inserted into a pair of guide holes 26 provided in the cover storage recessed section 24 of the printer cover 9, as shown in FIG. 7 and FIG. 8.

Figure 6:
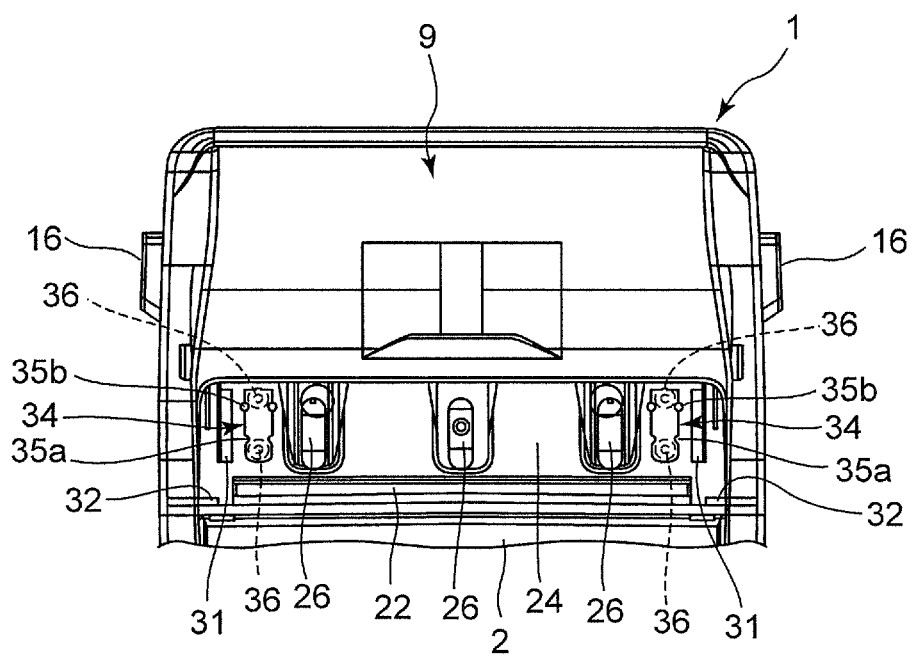
FIG. 6 is an enlarged planar view of main sections of the printer section shown in FIG. 5A in a state where the slide cover has been removed.

In this structure, each of the pair of guide holes 26 is a long hole that is formed within the cover storage recessed section 24 of the printer cover 9 in a manner to be elongated along the longitudinal direction of the device case 1, as shown in FIG. 6.

The cover attachment member 25 has a screw head section 25*a* and a screw thread section 25*b*, as shown in FIG. 8. The screw thread section 25*b* is screwed into a screw hole 27*a* of the guide boss section 27 of the slide cover 23 inserted into the guide hole 26 of the printer cover 9, whereby the cover attachment member 25 is arranged in a state where the screw head section 25*a* is not in contact with the undersurface of the printer cover 9.

According to this configuration, the slide cover 23 in a slidable state is constructed so as to not slip out from within the cover storage recessed section 24 of the printer cover 9 to the upper part.

In addition, a waterproof gasket 28 is provided on the undersurface of the slide cover 23 corresponding to the periphery of the recording paper ejection opening 22, as shown in FIG. 7 to FIG. 9C.

The waterproof gasket 28 is composed of an elastic material such as rubber or elastomer, and is arranged in a substantially rectangular shape on the undersurface of the slide cover 23.

In other words, the waterproof gasket 28 is provided on the undersurface of the slide cover 23 corresponding to the outer periphery of the recording paper ejection opening 22 such that the waterproof gasket 28 surrounds the outer periphery of the recording paper ejection opening 22 when the slide cover 23 conceals the recording paper ejection opening 22.

In this structure, a pressure contact section 22a with which the waterproof gasket 28 comes into pressure contact is provided in the outer periphery of the recording paper ejection opening 22 such that the pressure contact section 22a surrounds the outer periphery of the recording paper ejection opening 22, as shown in FIG. 8.

The pressure contact section 22a is provided on both the edge portion of the upper case 2 positioned in the outer peripheral edge of the recording paper ejection opening 22 and the edge portion of the cover storage recessed section 24 of the printer cover 9 positioned in the outer peripheral edge of the recording paper ejection opening 22, such that the pressure contact section 22a surrounds the outer periphery of the recording paper ejection opening 22.

Furthermore, the slide cover 23 is configured such that the position of the slide cover 23 in the up/down direction is controlled by a guide member 29 when the slide cover 23 slides within the cover storage recessed section 24 of the printer cover 9, as shown in FIG. 7 to FIG. 9C.

Namely, the guide member 29 does not come in contact with the waterproof gasket 28 on the top surface of the cover storage recessed section 24 of the printer cover 9 during a sliding motion of the slide cover 23, and conversely the waterproof gasket 28 does come in contact with the top of the pressure contact section 22a positioned in the outer peripheral edge of the recording paper ejection opening 22 when the slide cover 23 conceals the recording paper ejection opening 22 and the sliding motion is completed.

In this structure, the guide member 29 includes a guide projected section 30 that is provided on the undersurface of the slide cover 23 and a guide rail section 31 that is provided on the top surface of the cover storage recessed section 24 of the printer cover 9 and guides the guide projected section 30 while lifting the guide projected section 30 upward, as shown in FIG. 6 to FIG. 9C.

The guide projected section 30 is formed in a substantially semicircular arc and projected downward from the undersurface of the slide cover 23 positioned on the outer side in the longitudinal direction of the waterproof gasket 28.

The guide rail section 31 is provided on the top surface of the cover storage recessed section 24 of the printer cover 9 along the sliding direction of the slide cover 23, as shown in FIG. 6 and FIG. 8.

In order that the slide cover 23 is closed, the guide rail section 31 guides the guide projected section 30 of the slide cover 23 while gradually inclining the slide cover 23 along the curved surface of the printer cover 9, and eventually guides the guide projected section 30 in a substantially horizontal direction and places the slide cover 23 on the recording paper ejection opening 22.

Figure 9A:
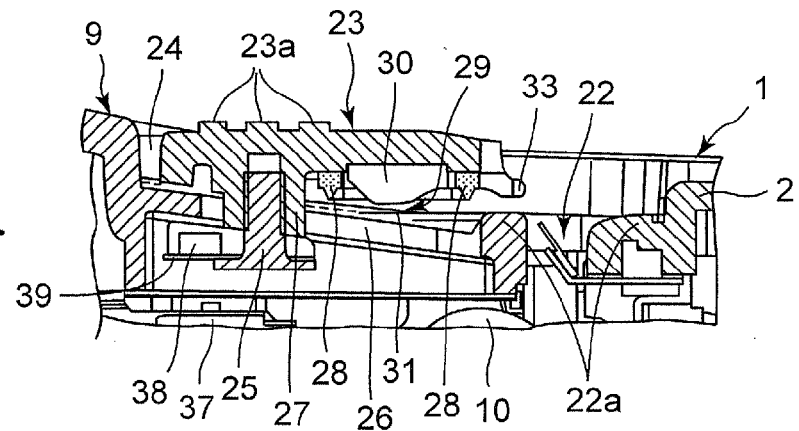
Figure 9B:
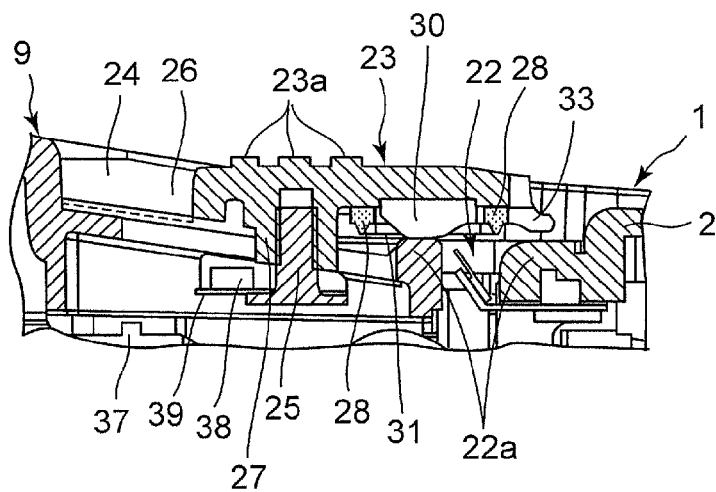

In other words, the guide rail section 31 is formed to guide the guide projected section 30 while lifting the guide projected section 30 upward such that the waterproof gasket 28 does not come into contact with the top surface of the cover storage recessed section 24, from the position where the slide cover 23 is the farthest from the recording paper ejection opening 22, as shown in FIG. 8, to the position where the slide cover 23 comes close to the recording paper ejection opening 22, as shown in FIG. 9B.

Figure 9C:
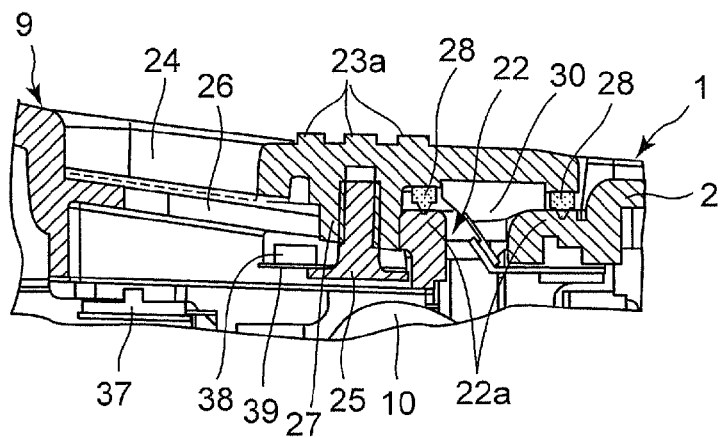

In addition, in order that the slide cover 23 covers the recording paper ejection opening 22, the guide rail section 31 lifts upward the guide projected section 30 together with the slide cover 23 and moves the waterproof gasket 28 onto the pressure contact section 22a positioned in the outer peripheral edge of the recording paper ejection opening 22, as shown in FIG. 9B. In order that the slide cover 23 covers and completely conceals the recording paper ejection opening 22, the guide rail section 31 drops the guide projected section 30 into the recording paper ejection opening 22, thereby placing the waterproof gasket 28 in contact with the top of the pressure contact section 22a positioned in the outer peripheral edge of the recording paper ejection opening 22, as shown in FIG. 9C.

On the other hand, the portion of the upper case 2 of the device case 1 positioned in the edge portion of the recording paper ejection opening 22 is provided with a pressing projected section 32 that projects towards the slide cover 23, as shown in FIG. 5A, FIG. 5B, FIG. 10A, and FIG. 10B.

In addition, the slide cover 23 is provided with an engaging projected section 33 that is pressed towards the top surface of the upper case 2 by the pressing projected section 32 when the slide cover 23 conceals the recording paper ejection opening 22 and a sliding motion is completed.

In other words, the pressing projected section 32 of the upper case 2 is provided projecting towards the slide cover 23 side on each of both sides of the end portion of the upper case 2 positioned on both end portions in the longitudinal direction of the recording paper ejection opening 22, as shown in FIG. 5A and FIG. 5B.

Figure 10A:
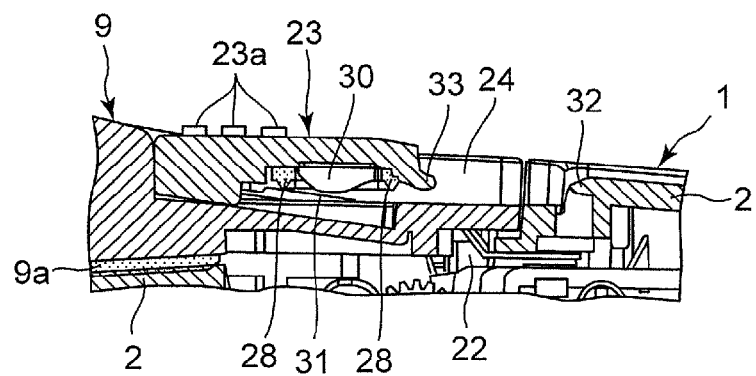

In order that the slide cover 23 covers the recording paper ejection opening 22, the engaging projected section 33 of the slide cover 23 moves towards the underside of the pressing projected section 32 in a state where the guide projected section 30 of the slide cover 23 is lifted upward by the guide rail section 31, as shown in FIG. 5A, FIG. 5B, and FIG. 10A.

Figure 10B:
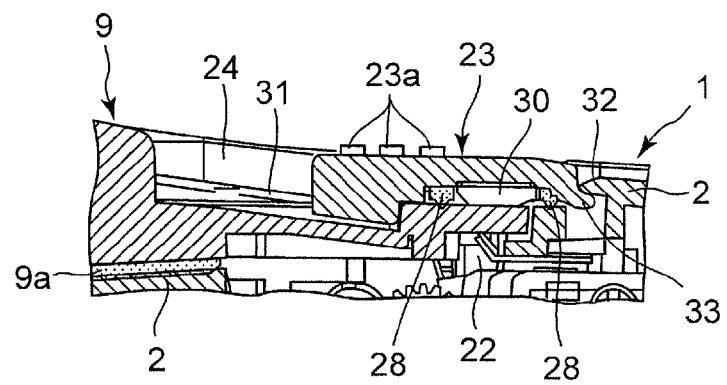

In addition, in order that the guide projected section 30 of the slide cover 23 moves over the horizontal portion of the guide rail section 31, and then covers and completely conceals the recording paper ejection opening 22, the engaging projected section 33 comes in contact with the underside of the pressing projected section 32 of the device case 1 and is pressed downward by the pressing projected section 32, as shown in FIG. 5A, FIG. 5B, and FIG. 10B. Therefore, the waterproof gasket 28 comes in pressure contact with the top of the pressure contact section 22a positioned in the outer peripheral edge of the recording paper ejection opening 22.

As a result, when the printer section 6 is not in use, the slide cover 23 is slid towards the input display section 4 side and the recording paper ejection opening 22 is concealed, whereby the waterproof gasket 28 comes in pressure contact with the pressure contact section 22a positioned in the outer peripheral edge of the recording paper ejection opening 22, as shown in FIG. 5B and FIG. 9C. Therefore, water drops, such as rain, will be prevented from seeping into the device case 1 from the recording paper ejection opening 22.

In addition, when the printer section 6 is in use, the slide cover 23 is slid in the direction opposite to the input display section 4 and the recording paper ejection opening 22 is opened, as shown in FIG. 5A and FIG. 8. As a result, the recording paper on which information has been printed by the print head 8 is ejected to the outside of the device case 1 from the recording paper ejection opening 22.

The slide cover 23 is configured such that the sliding position is regulated by a cover position regulating member 34, as shown in FIG. 6 and FIG. 7.

The cover position regulating member 34 includes a first restricting projected section 35a and a second restricting projected section 35b that are respectively provided within the cover storage recessed section 24 of the printer cover 9, and an elastic contact projected section 36 that is provided on the undersurface of the slide cover 23 such that the position of the elastic contact projected section 36 is restricted by the first restricting projected section 35a and the second restricting projected section 35b, respectively.

In this structure, the first restricting projected section 35a is provided in the recording paper ejection opening 22 side within the cover storage recessed section 24 of the printer cover 9, as shown in FIG. 6. When the slide cover 23 slides and conceals the recording paper ejection opening 22, the first restricting projected section 35a locks the elastic contact projected section 36 of the slide cover 23 with a click feeling, whereby the closed position of the slide cover 23 is regulated.

In addition, the second restricting projected section 35b is provided in a position away from the recording paper ejection opening 22 side within the cover storage recessed section 24 of the printer cover 9, as shown in FIG. 6. When the slide cover 23 slides and opens the recording paper ejection opening 22, the second restricting projected section 35b locks the elastic contact projected section 36 of the slide cover 23 with a click feeling, whereby the open position of the slide cover 23 is regulated.

Furthermore, the elastic contact projected section 36 of the slide cover 23, composed of an elastic material such as rubber, is provided in a cylindrical shape on the portion of the undersurface of the slide cover 23 positioned away from the recording paper ejection opening 22, as shown in FIG. 7B. When the slide cover 23 slides and conceals the recording paper ejection opening 22, the position of the elastic contact projected section 36 is restricted by the first restricting projected section 35a. When the slide cover 23 slides and opens the recording paper ejection opening 22, the position of the elastic contact projected section 36 is restricted by the second restricting projected section 35b.

On the other hand, the printer section 6 is provided with a detecting section 37 that outputs a detection signal for permitting to print when the slide cover 23 slides and opens the recording paper ejection opening 22, as shown in FIG. 8.

The detecting section 37 is a magnetic sensor for detecting magnetism, which is provided within the device case 1 in a part corresponding to the cover storage recessed section 24 of the printer cover 9 and in a part farthest away from the recording paper ejection opening 22.

In other words, when the slide cover 23 is slides and opens the recording paper ejection opening 22, a magnet 38 provided on the slide cover 23 side is positioned close to the upper side of the detecting section 37, as shown in FIG. 8. As a result, the detecting section 37 detects the magnetic field of the magnet 38 and outputs the detection signal as an electrical signal.

In this structure, the magnet 38 is attached to an attachment support plate 39 provided in the cover attachment member 25 for slidably attaching the slide cover 23 to the printer cover 9.

Next, the functions of the above-described printer section 6 in a portable information terminal will be described.

When information displayed on the input display section 4 of the device case 1 is to be printed on recording paper by the printer section 6, first, the slide cover 23 of the printer cover 9 is slid and the recording paper ejection opening 22 is opened.

At this time, the recording paper is placed in advance between the print head 8 and the platen roller 10 in a closed state where the printer cover 9 conceals the recording paper storage section 7.

In this state, when the print head 8 starts printing, the information displayed on the input display section 4 will be printed on the recording paper line by line. The platen roller 10 rotates to sequentially eject the printed recording paper from the recording paper ejection opening 22. Accordingly, the roll-form recording paper stored in the recording paper storage section 7 is sequentially fed between the print head 8 and the platen roller 10, and subsequent information is sequentially printed by this feeding of the recording paper.

Thus, information printed on the recording paper is ejected from the recording paper ejection opening 22.

Also, when printing is not being performed by the printer section 6 of the portable information terminal, the slide cover 23 is slid and the recording paper ejection opening 22 is concealed by the slide cover 23, where the printer cover 9 is in a closed state. As a result, even if carried outdoors in wet weather, the portable information terminal can be favorably carried without being affected by water drops, such as rain water.

At this time, when the slide cover 23 is slid towards the recording paper ejection opening 22, first, the elastic contact projected section 36 of the slide cover 23 moves against the positional restriction by the second restricting projected section 35b within the cover storage recessed section 24 of the printer cover 9, and the guide projected section 30 of the slide cover 23 moves and is guided by the guide rail section 31.

Namely, when the elastic contact projected section 36 of the slide cover 23 disengages from the second restricting projected section 35b, the guide projected section 30 moves on top of the guide rail section 31, the slide cover 23 is lifted upward by the guide projected section 30. As a result, the slide cover 23 moves from the position where the slide cover 23 is farthest separated from the recording paper ejection opening 22 to the position where the slide cover 23 comes close to the recording paper ejection opening 22, in a state where the waterproof gasket 28 does not come in contact with the top surface of the cover storage recessed section 24.

The magnet 38 of the attachment support plate 39 provided in the cover attachment member 25 of the printer cover 9 moves together with the slide cover 23 when the slide cover 23 moves to the position which comes close to the recording paper ejection opening 22, as described above. Accordingly, the magnet 38 moves away from the detecting section 37 provided within the device case 1.

As a result, the detecting section 37 cannot detect the magnetic field of the magnet 38 and does not output the detection signal for enabling printing, whereby the printer section 6 stops operating.

When the guide projected section 30 of the slide cover 23 reaches the substantially horizontal portion of the guide rail section 31, the guide projected section 30 moves on top of the substantially horizontal portion of the guide rail section 31, whereby the waterproof gasket 28 provided in the slide cover 23 moves towards the top of the pressure contact section 22a positioned in the outer peripheral edge of the recording paper ejection opening 22.

At this time, the slide cover 23 covers the recording paper ejection opening 22, and the engaging projected section 33 provided in the slide cover 23 moves towards the underside of the pressing projected section 32 of the upper case 2.

In this state, when the slide cover 23 moves further in the direction where the slide cover 23 conceals the recording paper ejection opening 22, and then covers and completely conceals the recording paper ejection opening 22, the position of the elastic contact projected section 36 of the slide cover 23 is restricted by the first restricting projected section 35a within the cover storage recessed section 24 of the printer cover 9, and the guide projected section 30 of the slide cover 23 drops in the horizontal portion of the guide rail section 31.

At this time, the elastic contact projected section 36 of the slide cover 23 elastically passes through the first restricting projected section 35a, whereby the position of the elastic contact projected section 36 is restricted. As a result, the closed position of the slide cover 23 is regulated.

In addition, at this time, the engaging projected section 33 provided in the slide cover 23 is pressed downward by the pressing projected section 32 of the upper case 2. Therefore, the waterproof gasket 28 comes in pressure contact with the top of the pressure contact section 22a positioned in the outer peripheral edge of the recording paper ejection opening 22.

As a result, the recording paper ejection opening 22 is sealed by the waterproof gasket 28 in a state where the recording paper ejection opening 22 is concealed by the slide cover 23.

Therefore, even if carried outdoors in wet weather, water drops, such as rain water can be prevented from seeping into the recording paper ejection opening 22.

Namely, water drops, such as rain water, can be prevented from directly seeping into the recording paper ejection opening 22 by the slide cover 23. Moreover, since the waterproof gasket 28 can prevent water drops, such as rain water, that become adhered to the slide cover 23 from wrapping around to the undersurface side of the slide cover 23, the portable information terminal can be favorably carried without being affected by water drops, such as rain water.

In addition, when opening the recording paper ejection opening 22, the slide cover 23 is slid in the direction away from the recording paper ejection opening 22.

At this time, the elastic contact projected section 36 of the slide cover 23 moves against the positional restriction by the first restricting projected section 35a. In addition, the engaging projected section 33 of the slide cover 23 disengages from the underside of the pressing projected section 32 of the upper case 2 following along with the sliding of the slide cover 23, and the guide projected section 30 of the slide cover 23 is lifted upward by the guide rail section 31, whereby the slide cover 23 moves.

At this time, the slide cover 23 is lifted upward by the guide projected section 30. As a result, the waterproof gasket 28 of the slide cover 23 rises above the cover storage recessed section 24 of the printer cover 9.

In this state, when the slide cover 23 is slid further in the direction away from the recording paper ejection opening 22, the guide projected section 30 of the slide cover 23 moves while being guided obliquely upward by the guide rail section 31.

As described above, the guide projected section 30 lifts upward the slide cover 23 while moving obliquely upward on the guide rail section 31. As a result, the slide cover 23 moves away from the recording paper ejection opening 22 and opens the recording paper ejection opening 22 in a state where the waterproof gasket 28 does not come in contact with the top surface of the cover storage recessed section 24.

In addition, the magnet 38 of the attachment support plate 39 provided in the cover attachment member 25 of the slide cover 23 moves together with the slide cover 23 when the slide cover 23 moves away from the recording paper ejection opening 22 side. As a result, the magnet 38 comes close to the upper side of the detecting section 37 provided within the device case 1.

Therefore, the detecting section 37 detects the magnet 38 and outputs the detection signal for enabling printing. As a result, the printer section 6 becomes ready to print.

At this time, the position of the elastic contact projected section 36 of the slide cover 23 is restricted by the second restricting projected section 35b, whereby the open position of the slide cover 23 is regulated.

By the way, when the recording paper stored in the recording paper storage section 7 of the printer section 6 is being exchanged, by performing a rotation operation of the operating lever sections 16 of the operating members 13 exposed on either side of the device case 1, the printer cover 9 opens.

At this time, when the operating lever sections 16 are rotated in the clockwise direction, the rotating shaft sections 15 rotate. The interlocking rotating sections 17 of the lock members 14 rotate in the clockwise direction in accordance with the rotation of the rotating shaft sections 15, whereby the lock sections 20 disengage from the groove sections 18a of the engaging sections 18 of the printer cover 9.

Then, the lifting upward sections 21 of the lock members 14 rotate in accordance with the rotation of the interlocking rotating sections 17, thereby lifting upward the engaging sections 18 of the printer cover 9.

Accordingly, the printer cover 9 is lifted upward by the lifting upward sections 21 of the lock members 14. Then, the printer cover 9 rotates around the rotating support shafts 12 in the opening direction, thereby hovering above the device case 1.

And then, this hovering printer cover 9 is pulled upward and rotated around the rotating support shafts 12 in the opening direction to stand upright on the device case 1. As a result, the roll-form recording paper can be exchanged.

Thus, the above drip-proof structure of the recording paper ejection opening 22 in this portable information terminal comprises: the slide cover 23 which is slidably attached in an openable/closable manner to the printer cover 9 of the device case 1 and conceals the recording paper ejection opening 22; the waterproof gasket 28 which is provided in the slide cover 23 and surrounds the recording paper ejection opening 22 when the slide cover 22 conceals the recording paper ejection opening 22; and the guide member 29 which prevents the waterproof gasket 28 from coming into contact with the printer cover 9 during a sliding motion of the slide cover 23, and the waterproof gasket is pressed on both sides between the slide cover 23 and the device case 1 when the slide cover 23 conceals the recording paper ejection opening 22 and the sliding motion is completed. As a result, water drops, such as rain water, can be prevented from seeping into the recording paper ejection opening 22, thereby enhancing the durability of the waterproof gasket 28.

In other words, in the drip-proof structure of the recording paper ejection opening 22, the waterproof gasket 28 is pressed on both sides between the slide cover 23 and the pressure contact section 22a on the device case 1 side when the slide cover 23 conceals the recording paper ejection opening 22.

Therefore, the above structure can securely prevent water drops that are adhered to the slide cover 23 from wrapping around the undersurface of the slide cover 23 and seeping into the recording paper ejection opening 22, even if water drops, such as rain water, are adhered to the slide cover 23.

In addition, in the drip-proof structure of the recording paper ejection opening 22, since the slide cover 23 can be made to slide and the waterproof gasket 28 provided in the slide cover 23 does not come into contact with the printer cover 9 by the guiding member 29, when the slide cover 23 is slid and conceals the recording paper ejection opening 22, the sliding motion of the slide cover 23 can prevent abrasion of the waterproof gasket 28. Accordingly, the durability of the waterproof gasket 28 can be markedly improved.

In this structure, the portion of the upper case 2 positioned in the edge portion of the recording paper ejection opening 22 is provided with the pressing projected section 32 that projects towards the slide cover 23. The slide cover 23 is provided with the engaging projected section 33 that is pressed towards the top of the upper case 2 by the pressing projected section 32 when the slide cover 23 conceals the recording paper ejection opening 22 and a sliding motion is completed.

Therefore, when the slide cover 23 conceals the recording paper ejection opening 22 and a sliding motion is completed, the waterproof gasket 28 can be securely pressed on both sides and placed in pressure contact between the slide cover 23 and the pressure contact section 22a on the device case 1 side. As a result, the recording paper ejection opening 22 can be securely and favorably sealed.

In addition, in the drip-proof structure of the recording paper ejection opening 22 of the portable information terminal, the device case 1 is provided with the recording paper storage section 7 that stores the recording paper, and the printer cover 9 that conceals the recording paper storage section 7 in an openable/closable manner. The slide cover 23 is slidably attached to the printer cover 9.

As a result of this configuration, even when the device case 1 is provided with the recording paper storage section 7 that stores the recording paper, the printer cover 9 can conceal the recording paper storage section 7 in an openable/closable manner. In addition, even when the device case 1 is provided with the printer cover 9, the slide cover 23 can slide and conceal the recording paper ejection opening 22 in a state where the printer cover 9 closes. Therefore, the recording paper ejection opening 22 can be securely and favorably concealed.

In addition, when the slide cover 23 conceals the recording paper ejection opening 22, the engaging projected section 33 of the slide cover 23 is pressed by the pressing projected section 32 of the device case 1, whereby the printer cover 9 can be prevented from freely opening.

As a result, even if carried outdoors in wet weather, the portable information terminal can be safely and favorably carried in a state where drip-proofness is ensured.

In this structure, the printer cover 9 is provided with the cover storage recessed section 24 where the slide cover 23 is slidably arranged. Accordingly, the slide cover 23 can be slid within the cover storage recessed section 24 even when the slide cover 23 is slidably provided in the printer cover 9.

In addition, the slide cover 23 barely projects above the printer cover 9, whereby the slide cover 23 does not disturb a user or get caught on objects when carrying the portable information terminal. Accordingly, the portable information terminal can be compactly and favorably carried.

In addition, in the drip-proof structure of the recording paper ejection opening 22, the guide member 29 includes: the guide projected section 30 provided on the undersurface of the slide cover 23; and the guide rail section 31 that is provided on the printer cover 9 where the slide cover 23 slides, and that guides the guide projected section 30 while lifting the guide projected section 30 upward.

As a result of this configuration, the slide cover 23 can be smoothly slid without waterproof gasket 28 coming in contact with the printer cover 9 while the slide cover 23 is being slid.

In addition, when the slide cover 23 conceals the recording paper ejection opening 22 and a sliding motion is completed, the waterproof gasket 28 can be pressed on both sides and placed in pressure contact between the slide cover 23 and the pressure contact section 22a on the device case 1 side.

In other words, the guide rail section 31 can smoothly guide the slide cover 23 such that the waterproofing gasket 28 does not come in contact with the top surface of the cover storage recessed section 24 of the printer cover 9, until the slide cover 23 comes close to the recording paper ejection opening 22.

In addition, when the slide cover 23 covers the recording paper ejection opening 22, the guide rail section 31 can lift upward the guide projected section 30 together with the slide cover 23, and move the waterproof gasket 28 onto the pressure contact section 22a positioned in the outer peripheral edge of the recording paper ejection opening 22.

Therefore, when the slide cover 23 covers and completely conceals the recording paper ejection opening 22, the guide rail section 31 drops the guide projected section 30, thereby unfailingly placing the waterproof gasket 28 in contact with the top of the pressure contact section 22a positioned in the outer peripheral edge of the recording paper ejection opening 22.

Furthermore, the drip-proof structure of the recording paper ejection opening 22 comprises the detecting section 37 that outputs the detection signal for enabling printing when the slide cover 23 is slid and opens the recording paper ejection opening 22.

As a result, the detection signal from the detecting section 37 makes the print head 8 of the printer section 6 ready to print when the slide cover 23 opens the recording paper ejection opening 22.

Therefore, the printer section 6 can be unfailingly prevented from printing when the slide cover 23 is accidentally in a closed state, whereby the recording paper can be prevented from being jammed.

In this structure, the detecting section 37 is a magnetic sensor that detects magnetism, and is provided within the device case 1 such that the detecting section 37 corresponds to the magnet 38 provided in the slide cover 23 when the slide cover 23 opens the recording paper ejection opening 22.

In this configuration, the magnet 38 is away from the detecting section 37 when the slide cover 23 conceals the recording paper ejection opening 22. As a result, the detecting section 37 does not detect the magnetic field of the magnet 38 and does not output the detection signal. Therefore, the printer section 6 can be reliably made to stop operating.

In addition, when the slide cover 23 opens the recording paper ejection opening 22 and the magnet 38 is positioned above the detecting section 37, the detecting section 37 detects the magnetic field of the magnet 38 and outputs the detection signal. As a result, the printer section 6 becomes ready to print.

In addition, the drip-proof structure of the recording paper ejection opening 22 includes the cover position regulating member 34 that regulates the closed position of the slide cover 23 when the slide cover 23 slides and conceals the recording paper ejection opening 22, and that regulates the open position of the slide cover 23 when the slide cover 23 slides and opens the recording paper ejection opening 22.

As a result of this configuration, the slide cover 23 can be unfailingly regulated to the closed position when the slide cover 23 conceals the recording paper ejection opening 22.

In addition, the slide cover 23 can be unfailingly regulated to the open position when the slide cover 23 opens the recording paper ejection opening 22. As a result, the position of the slide cover 23 can be favorably regulated so as not to slide by itself.

In this structure, the cover position regulating member 34 includes the first restricting projected section 35a and a second restricting projected section 35b that is provided within the cover storage recessed section 24 of the printer cover 9, and the elastic contact projected section 36 that is provided on the undersurface of the slide cover 23 such that the position of the elastic contact projected section 36 is restricted by the first restricting projected section 35a and the second restricting projected section 35b.

As a result of this configuration, when the slide cover 23 conceals the recording paper ejection opening 22, the position of the elastic contact projected section 36 of the slide cover 23 is restricted by the first restricting projected section 35a, whereby the slide cover 23 can be unfailingly regulated to the closed position.

In addition, when the slide cover 23 opens the recording paper ejection opening 22, the position of the elastic contact projected section 36 of the slide cover 23 is restricted by the second restricting projected section 35b, whereby the slide cover 23 can be unfailingly regulated to the open position.

Furthermore, in the portable information terminal, in order that the printer cover 9 is opened, the interlocking rotating sections 17 of the lock members 14 rotate by the rotating operation of the operating members 13 of the cover opening and closing apparatus 11, whereby the lock sections 20 rotate in accordance with the rotation of the interlocking rotating sections 17. As a result, the lock on the engaging sections 18 of the printer cover 9 can be released.

When the interlocking rotating sections 17 further rotate in this state, the lifting upward sections 21 rotate in accordance with the rotation of the interlocking rotating sections 17, thereby lifting the engaging sections 18 of the printer cover 9. As a result, the printer cover 9 is opened.

As a result of this configuration, the operation for releasing the lock on the printer cover 9 by the lock members 14 and the operation for opening the printer cover 9 can be successively performed as a series of operations, by simply rotating the operating members 13.

In addition, in the portable information terminal, in order that the printer cover 9 is closed, when the printer cover 9 is placed on the device case 1 to cover the recording paper storage section 7, the engaging sections 18 of the printer cover 9 come into contact with the lifting upward sections 21 of the lock members 14.

When the end portion of the printer cover 9 is pressed downward in this state, the lifting upward sections 21 of the lock members 14 are pressed downward by the engaging sections 18 of the printer cover 9. As a result, the interlocking rotating sections 17 can be rotated and the lock sections 20 can be engaged with the engaging sections 18 of the printer cover 9.

Therefore, the printer cover 9 can be easily and unfailingly locked and closed without the operating members 13 being operated. Accordingly, closing operability of the printer cover 9 is favorable.

As described above, in the portable information terminal, when the slide cover 23 conceals the recording paper ejection opening 22, the waterproof gasket 28 can be pressed on both sides and placed in pressure contact between the slide cover 23 and the device case 1. Therefore, even when water drops, such as rain water, adhere to the slide cover 23, the water drops that become adhered to the slide cover 23 can be unfailingly prevented from wrapping around to the undersurface side of the slide cover 23 and seeping into the recording paper ejection opening 22.

In addition, in the portable information terminal, when the slide cover 23 slides and conceals the recording paper ejection opening 22, the slide cover 23 can be slid without the waterproof gasket 28 provided in the slide cover 23 coming into contact with the printer cover 9. Therefore, the sliding motion of the slide cover 23 can prevent abrasion of the waterproof gasket 28, thereby enhancing the durability of the waterproof gasket 28.

According to the above-described embodiment, the detecting section 37 is a magnetic sensor. However, the present invention is not limited thereto. For example, an optical sensor that includes a light-emitting element and a light-receiving element, or a button switch that is turned ON and OFF by a pressing operation of an operating element may be used as the detecting section.

In addition, according to the above-described embodiment, the waterproof gasket 28 is provided in the slide cover 23. However, the present invention is not limited thereto. For example, the waterproof gasket 28 may be provided in the portion of the upper case 2 positioned in the periphery of the recording paper ejection opening 22.

In this structure, the slide cover 23 is configured to come into pressure contact with the waterproof gasket 28 when the slide cover 23 covers and conceals the recording paper ejection opening 22.

In addition, according to the above-described embodiment, the slide cover 23 is slidably provided in the printer cover 9. However, the present invention is not limited thereto. The slide cover 23 may be slidably provided on the top surface of the upper case 2 of the device case 1.

In this structure, the cover storage recessed section 24 is provided on the top surface of the upper case 2, and the slide cover 23 is slidably provided within the cover storage recessed section 24.

Furthermore, according to the above-described embodiment, the present invention is applied to a portable information terminal. However, the present invention is not necessarily required to be applied to a portable information terminal, and can be widely applied to electronic devices including a printer, such as portable personal computers.

While the present invention has been described with reference to the preferred embodiments, it is intended that the invention be not limited by any of the details of the description therein but includes all the embodiments which fall within the scope of the appended claims.

What is claimed is:

1. An electronic device comprising:
    a slide cover which is slidably attached in an openable/closable manner to a device case and conceals a recording paper ejection opening provided in the device case;
    a waterproof gasket which is provided on either one of the slide cover and the device case in a part positioned in periphery of the recording paper ejection opening, and arranged between the slide cover and the device case surrounding the recording paper ejection opening, when the slide cover conceals the recording paper ejection opening; and
    a guide member which does not come in contact with the waterproof gasket on another side of the slide cover and the device case with which the waterproof gasket meets face to face during a sliding motion of the slide cover, and the waterproof gasket presses on both sides between the slide cover and the device case when the slide cover conceals the recording paper ejection opening and the sliding motion is completed.

2. The electronic device according to claim 1, wherein a part of the device case positioned in an edge portion of the recording paper ejection opening is provided with a pressing projected section which projects towards the slide cover, and wherein the slide cover is provided with an engaging projected section which is pressed towards the device case by the pressing projected section, when the slide cover conceals the recording paper ejection opening and the sliding motion is completed.

3. The electronic device according to claim 1, wherein the waterproof gasket provided in the slide cover slidably faces towards the device case.

4. The electronic device according to claim 1, wherein the device case is provided with a recording paper storage section which stores recording paper, and a printer cover which conceals the recording paper storage section in an openable/closable manner, and wherein the slide cover is slidably attached to the printer cover.

5. The electronic device according to claim 4, wherein the printer cover is provided with a cover storage recessed section where the slide cover is slidably arranged.

6. The electronic device according to claim 1, wherein the guide member comprises:

a guide projected section which is provided on the undersurface of the slide cover; and a guide rail section which is provided on the device case side where the slide cover slides, and which guides the guide projected section while lifting the guide projected section upward.

7. The electronic device according to claim 1, further comprising:

a detecting section which outputs a detection signal for enabling printing, when the slide cover is slid and opens the recording paper ejection opening.

8. The electronic device according to claim 1, further comprising:

a cover position regulating member which regulates a closed position of the slide cover when the slide cover is slid and conceals the recording paper ejection opening, and which regulates an opened position of the slide cover when the slide cover is slid and opens the recording paper ejection opening.

* * * * *